(12) United States Patent
Hamamjy et al.

(10) Patent No.: US 7,888,240 B2
(45) Date of Patent: Feb. 15, 2011

(54) METHOD OF FORMING PHASE CHANGE MEMORY DEVICES IN A PULSED DC DEPOSITION CHAMBER

(75) Inventors: Roger Hamamjy, San Jose, CA (US);
Kuo-Wei Chang, Santa Clara, CA (US);
Sean Jong Lee, Santa Clara, CA (US);
Chong W. Lim, Santa Clara, CA (US)

(73) Assignee: STMicroelectronics S.R.L., Agrate Brianza (IT)

( * ) Notice: Subject to any disclaimer, the term of this patent is extended or adjusted under 35 U.S.C. 154(b) by 563 days.

(21) Appl. No.: 11/974,168

(22) Filed: Oct. 10, 2007

(65) Prior Publication Data
US 2008/0102560 A1    May 1, 2008

(30) Foreign Application Priority Data
Oct. 10, 2006 (EP) .................................. 06425696

(51) Int. Cl.
*H01L 21/326* (2006.01)
(52) U.S. Cl. .................................. 438/469; 257/E29.17
(58) Field of Classification Search .................. 438/469; 257/E29.17
See application file for complete search history.

(56) References Cited

U.S. PATENT DOCUMENTS

| 6,051,122 A * | 4/2000 | Flanigan ................. 204/298.11 |
| 6,086,730 A * | 7/2000 | Liu et al. ................. 204/192.16 |
| 2004/0198027 A1* | 10/2004 | Kawamura .................. 438/486 |
| 2006/0027451 A1* | 2/2006 | Park et al. ............. 204/192.26 |

FOREIGN PATENT DOCUMENTS

| EP | 0598362 A1 | 5/1994 |
| EP | 1710324 A1 | 10/2006 |

* cited by examiner

*Primary Examiner*—Bradley K Smith
*Assistant Examiner*—Amar Movva
(74) *Attorney, Agent, or Firm*—Lisa K. Jorgenson; Karl L. Klassen; Seed IP Law Group PLLC (57) ABSTRACT

A phase change memory including an ovonic threshold switch is formed using a pulsed direct current (DC) deposition chamber using pulsed DC. Pulsed DC is used to deposit a chalcogenide film. Pulsed DC may be also used to deposit a carbon film.

19 Claims, 7 Drawing Sheets

METHOD OF FORMING PHASE CHANGE MEMORY DEVICES IN A PULSED DC DEPOSITION CHAMBER

BACKGROUND

1. Technical Field

This invention relates generally to a method of forming phase change memory devices.

2. Description of the Related Art

Phase change memory devices use phase change materials, i.e., materials that may be electrically switched between a generally amorphous and a generally crystalline state or between different detectable states of local order across the entire spectrum between completely amorphous and completely crystalline states, for electronic memory application. The state of the phase change materials is also non-volatile in that, when set in either a crystalline, semi-crystalline, amorphous, or semi-amorphous state representing a resistance value, that value is retained until changed by another programming event, as that value represents a phase or physical state of the material (e.g., crystalline or amorphous). The state is unaffected by removing electrical power.

At present, alloys of group VI of the periodic table, such as Te or Se, referred to as chalcogenides or chalcogenic materials, can advantageously be used in phase change cells as phase change materials. One chalcogenide is formed by a Ge, Sb and Te alloy ($Ge_2Sb_2Te_5$), also called GST, which is currently widely used for storing information in overwritable disks.

One step in the process for manufacturing memory devices is the deposition of the GST or chalcogenic layer. In fact, a common deposition technique, like conventional sputtering, is difficult to use for depositing layers of calcogenides, since the sputtering process could stop after a while or arcs could occur.

Another problem resides in the fact that for a proper functioning of the memory device, it may be necessary that the GST layer be deposited conformally, in particular, that a sufficiently thick, uniform GST layer is conformally deposited in openings, trenches or pores; furthermore, it is important that no void areas are formed.

However, the above conditions are difficult to obtain in case of a GST layer having a high thickness (e.g., greater than 120 nm) and/or when the openings, trenches or pores have a high aspect ratio (that is high depth compared with the width thereof).

Another step that may be improved in the process for manufacturing memory devices is the deposition of electrodes of carbon films by CVD (chemical vapor deposition). In fact, in this case the carbon target is hard to ignite.

BRIEF SUMMARY

One embodiment of the invention provides a process improved over the prior art.

In some embodiments, a method of forming a memory element is provided. The method includes forming a phase change memory element. The phase change memory element includes chalcogenide using a pulsed DC deposition chamber.

BRIEF DESCRIPTION OF THE SEVERAL VIEWS OF THE DRAWINGS

For the understanding of the present invention, preferred embodiments are now described, purely as non-limiting examples, with reference to the enclosed drawings, wherein.

DETAILED DESCRIPTION

Figure 1:
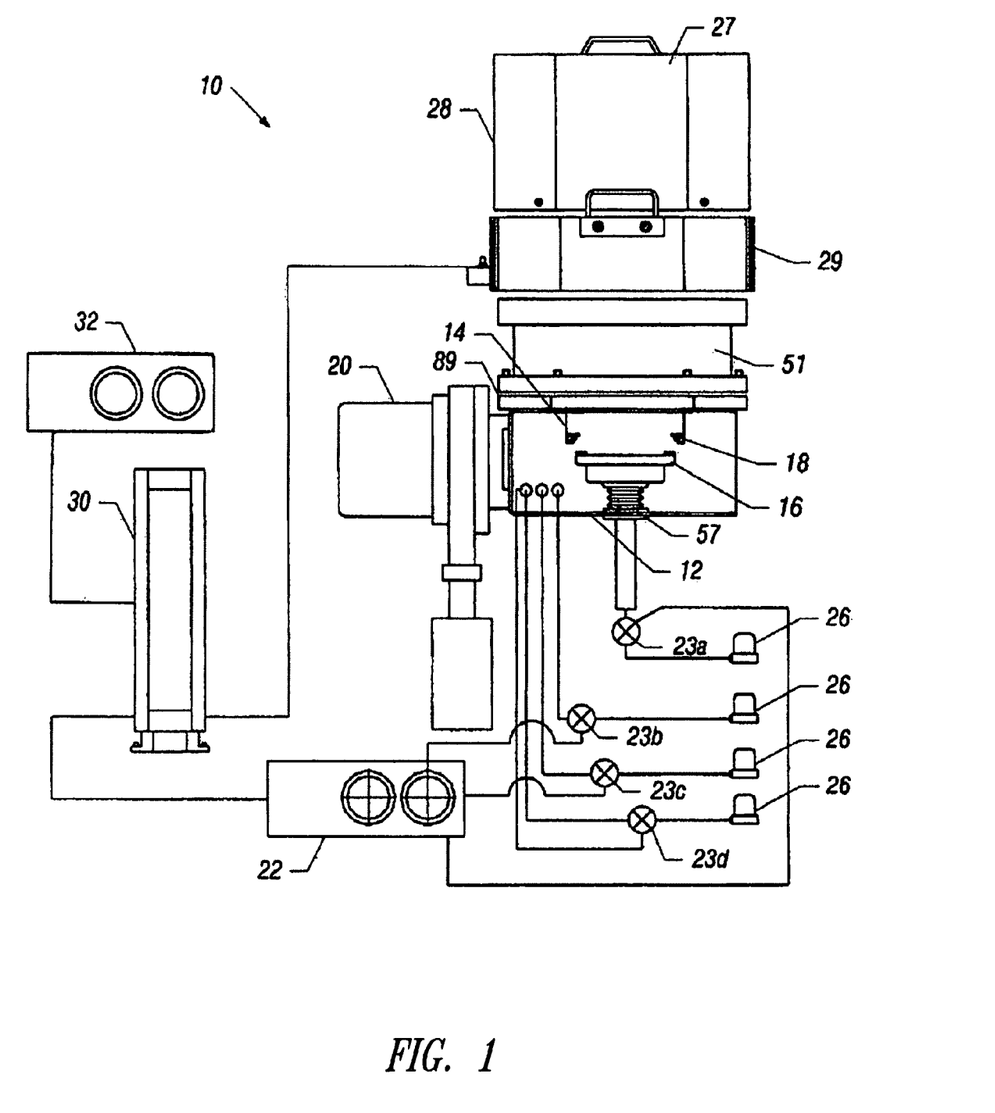
FIG. 1 is a depiction of a physical vapor deposition chamber in accordance with one embodiment of the present invention.

Referring to FIG. 1, a radio frequency (RF) and pulsed direct current (DC) physical vapor deposition (PVD) reactor 10 includes a vacuum chamber 12. The vacuum chamber 12 may be grounded and may be formed of metal. A controller 22 controls power supplies and mass flow controllers 23. The mass flow controllers 23 are responsible for inletting gas sources to the vacuum chamber 12 from the gas sources 26. The vacuum chamber 12 may have a shielding with twin wire arc spray.

A DC pulser 30 supplies a series of DC pulses that are effective for depositing chalcogenide films. The pulser 30 may be a 100 kHz pulser and may use an interlocked box. A 43 foot cable with a 7 foot pigtail may be used to couple the pulser 30 to the G-12 source 29.

Inside the chamber 12 is a grounded shield 14. The grounded shield 14 is coupled to a wafer clamp 18. The wafer clamp 18 clamps a wafer W (FIG. 2) on to a pedestal electrode 16. The electrode 16 is coupled to a bias potential controlled by the controller 22. The pedestal electrode 16 includes an electrostatic chuck 57.

At the top of the chamber 12 is a target (not shown) which is made of the material to be sputtered on the wafer.

The vacuum within the chamber 12 is established by cryopump 20 which communicates through a port (not shown) with the chamber 12. The cryopump 20 maintains a low pressure within the chamber 12. For example, the cryopump 20 may be a two phase pump.

A DC magnetron and radio frequency generator 28 includes a lid cover 27 made of metal, such a aluminum, instead of plastic, for better RF shielding to the source. A metal plate 89 is located between the target and the generator 28. The plate 89 may be formed of aluminum. The plate 89 enables better source grounding.

A radio frequency matching circuit 30 is situated over the generator 28. The RF matching circuit 30 balances out the radio frequency energy from the generator 28 to the chamber load. The RF matching circuit 30 enables the tuning of the RF power supply to the chamber 12. The matching circuit 30 is coupled to a radio frequency power supply 32, for example a 13.56 MHZ power supply. A radio frequency interference shield G-12 source 29 may be used.

A mass flow controller (MFC) 23b may supply 140 sccm for regulation. A heater MFC 23a may supply 45 sccm of argon process gas. An MFC 23c may supply 10 sccm of argon and an MFC 23d may supply 10 sccm of N2 for doping the deposited films.

In another embodiment, the pulser 30 may be a carbon pulsed 350 kHz pulser for depositing carbon films, underlayer, and cap for an ovonic threshold switch (OTS). In such a system, the source 29 may be an RFI shield G-10 source and the cabling may be an RFI cable. The 350 kHz pulser may result in better ignition of a carbon target.

Figure 2:
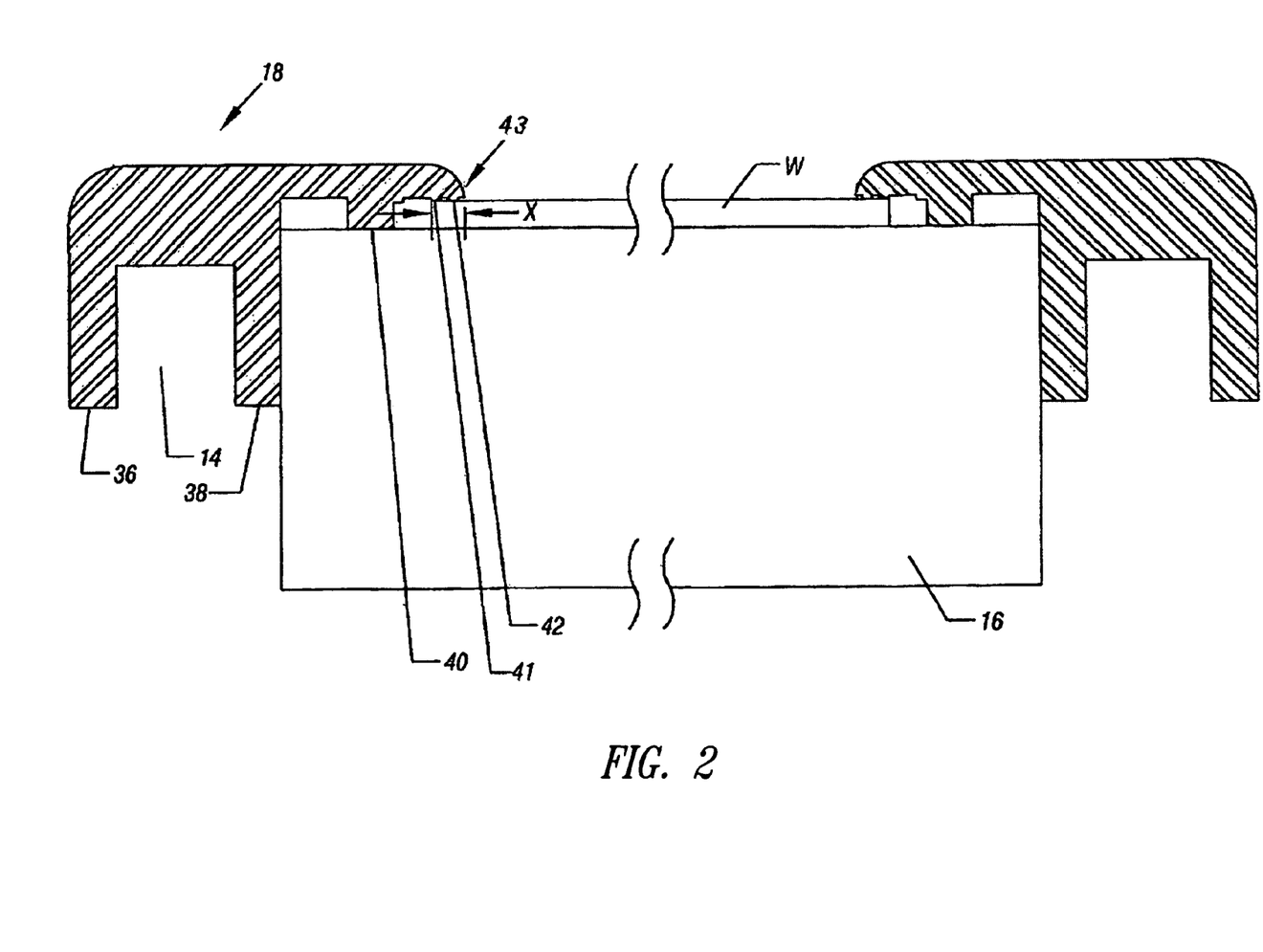
FIG. 2 is an enlarged depiction of a portion of the wafer clamp shown in FIG. 1 in accordance with one embodiment of the present invention.

Referring to FIG. 2, the clamp ring 18 includes a pair of downwardly extending arms 36 and 38 which engage, between them, the grounded shield 14. The ring 18 may be made of a ceramic material to isolate the electrostatic chuck 57 because radio frequency energy can travel through metal. An arm 40 extends transversely thereto and is useful for securing the wafer "W" in position on the pedestal electrode 16. The arm 40 includes a pair of spaced prongs 41 and 42. The outer prong 41 is spaced from the innermost edge 43 of the clamp ring 18 by a distance X.

The clamp ring 18 may have an edge exclusion, indicated by the distance X, of 6.5 millimeters. Such an edge exclusion results in minimal contact with the edge of the wafer W. Also, an increased edge exclusion may protect more surface area to prevent cross contamination in the RF physical vapor deposition environment.

Figure 3:
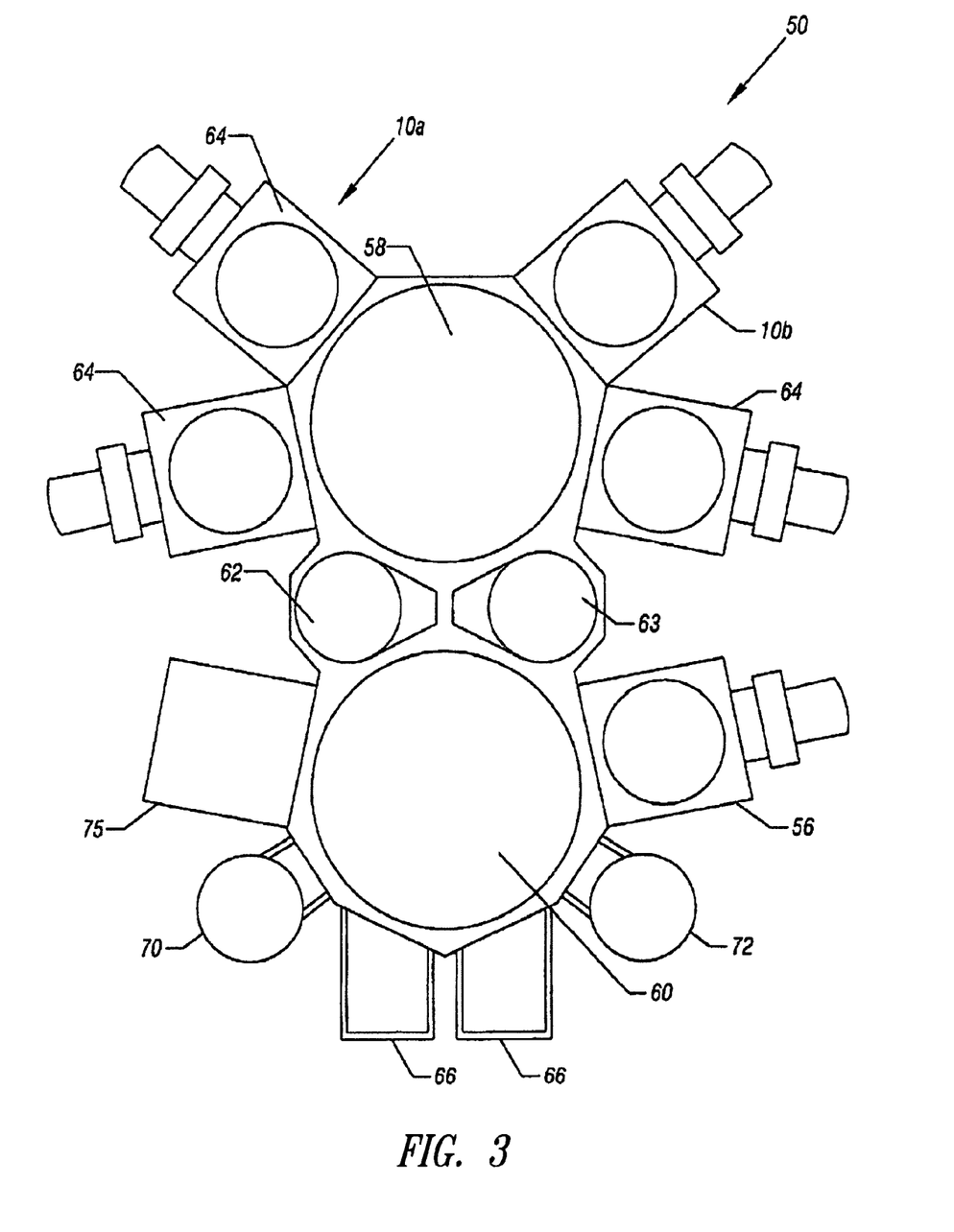
FIG. 3 is a top plan view of a cluster tool in accordance with one embodiment of the present invention.

Referring to FIG. 3, a staged-vacuum wafer processing cluster tool 50 may include reactors 10a and 10b, one reactor to deposit chalcogenide films with a 100 kHz pulser and the other reactor to deposit carbon films with 350 kHz pulser. A plurality of other chambers 64 may be situated around a transfer robot chamber 58 which includes a robot therein. The robot contained within the chamber 58 transfers wafers between each of the chambers 64 surrounding it and the reactors 10. The robot in the chamber 58 may receive wafers from a treatment chamber 62 and may pass wafers outwardly through a cool down treatment chamber 63. Each of the chambers 64 may be capable of processing the wafer in a different fabrication step. In some cases, each of the chambers may be able to implement one or more of the steps involved in physical vapor deposition.

A robot buffer chamber 60 also includes a robot. That robot receives wafers from a load lock chamber 66, and transfers them to different stations surrounding the robot buffer chamber 60 or to the treatment chamber 62 to be transferred to the transfer robot chamber 58. For example, the station 75 is a pre-clean chamber and the station 56 is a barrier chemical vapor deposition chamber. The stations 70 and 72 may be degassing and orientation chambers.

Thus, the robot in the robot buffer chamber 60 grabs a wafer from a load lock chamber 66 and transports the wafer to chambers 70, 72 for degassing and orientation. From there the robot in the chamber 60 transfers the wafer to chamber 56 for chemical vapor deposition and barrier layer formation. Then, the wafer may be transferred to the pre-clean chamber 75.

Finally, the wafer may be transferred by the robot in the robot buffer chamber 60 to the treatment chamber 62 for transfer to the robot chamber 58. From there, various physical vapor depositions (or other steps) may be completed, including the RF or pulsed DC deposition of highly resistive layers in the reactors 10. Once the processing is done, the robot in the chamber 58 transfers the wafer to the cool down treatment chamber 63. From there, it can be accessed by the robot buffer chamber 60 robot and transferred out of the cluster tool 50 through a load lock chamber 66.

The reactor 10 may RF sputter deposit more highly resistive films, such as chalcogenide films. However, the same chamber may also be utilized for pulsed direct current sputtering as well. Because the RF power source is isolated from the rest of the components in the tool 50, RF interference with other chambers and with computer cluster tool 50 controllers that control the robots and other RF sensitive elements may be reduced.

In particular, better RF shielding for the source may be provided, RF power may be isolated from traveling on communication lines, and better source grounding may be achieved. As a result, RF sputtering may be implemented in a cluster tool despite the sensitivity of other components in the cluster tool to the radio frequency power.

A phase change memory is formed utilizing the apparatus shown in FIG. 3. In one embodiment, a self-ionization plasma is established. A plasma that is self-ionizing may be established by using high pressure and high power to ignite the plasma. Then, the pressure and the power are reduced, but the plasma maintains its state with a very low flow of argon gas from the gas sources 26.

One advantage of such a system is that the amount of argon in the deposited layer is reduced. This may be advantageous in connection with forming phase change memories with ovonic threshold switch (OTS) access devices that use a chalcogenide material which generally does not change phase in operation. It has been determined that reducing the argon concentration within the chalcogenide used within the ovonic threshold switch improves the performance of the phase change memory.

The use of a self-ionization plasma enables lower argon flow to be used during the deposition of the chalcogenide layer used to form the ovonic threshold switch. This results in less contamination with the argon in the deposited layer.

In order to establish a self-ionization plasma, 2.0 MHZ power may be applied at the pedestal and 13.56 MHZ power may be applied at the target. In another embodiment, 60 MHZ power may be applied at the target and 13.56 MHZ power may be applied at the pedestal.

In some embodiments of the present invention, the ovonic threshold switch chalcogenide layer is deposited using a self-ionization plasma with chamber pressures below 3 milliTorr. In one advantageous embodiment, a chamber pressure of less than 1 milliTorr is used. Thus, the combination of a radio frequency or pulse energy deposition chamber, together with low argon pressures within the chamber, is effective to reduce the contamination by argon of chalcogenide containing layers used to form ovonic threshold switches.

To facilitate the application of the low pressure, the electrostatic chuck 57 is utilized. Higher pressure may be used to ignite the plasma, but the pressure may be reduced and the electrostatic chuck 57 is effective to leak a relatively small flow of argon into the region of chamber 12 around the wafer.

Conventionally, reducing the argon pressure to such a low pressure to avoid contamination would result in the extinguishing of the plasma. However, a self-ionization plasma may be used at relatively low gas pressures.

Figure 4:
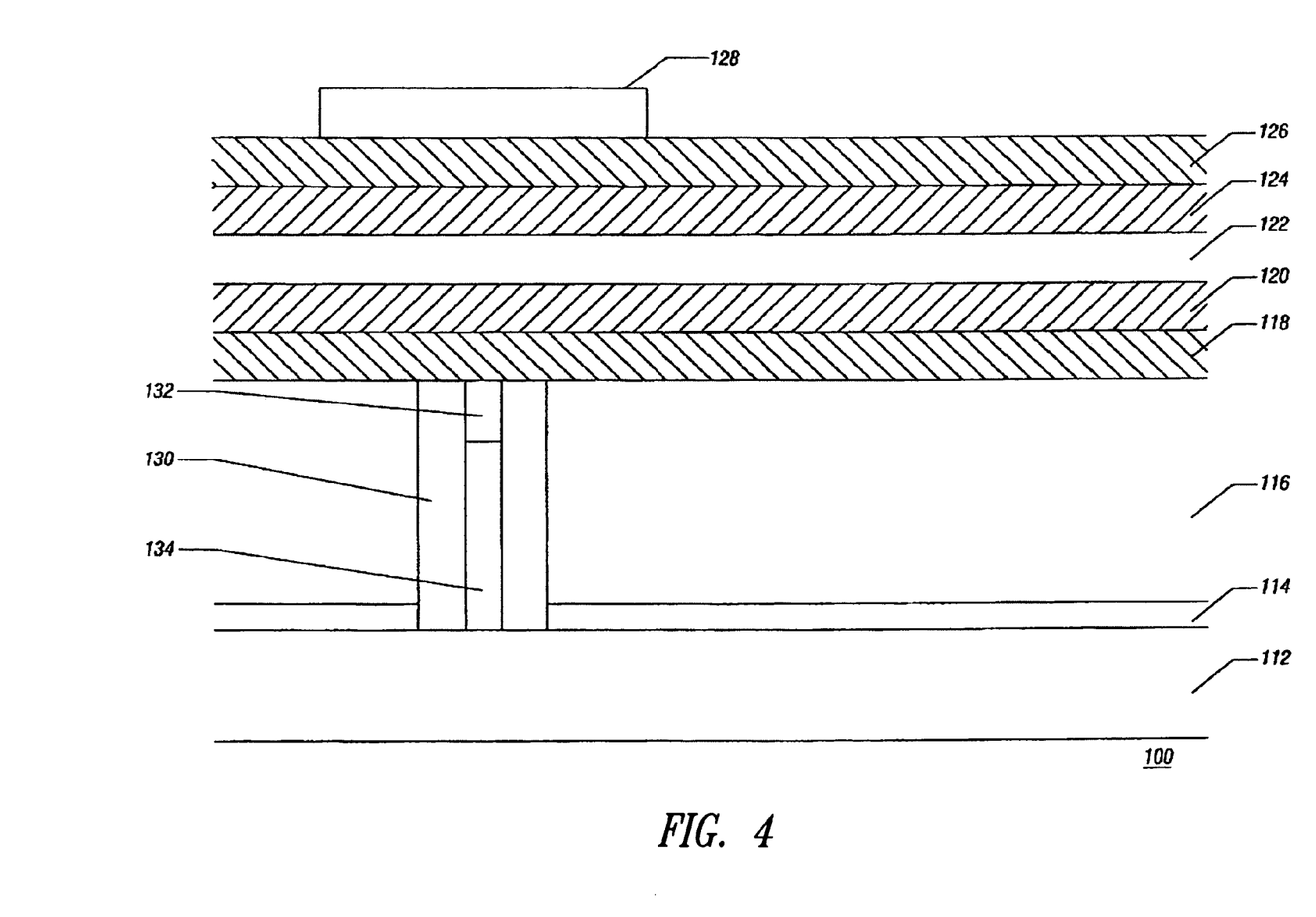
FIG. 4 is an enlarged, cross-section of a phase change memory at an early stage of manufacture according to one embodiment.

Referring to FIG. 4, a phase change memory may be formed of a stack including an ovonic unified memory (OUM) underlying a selection device in the form of an ovonic threshold switch. The ovonic unified memory is formed on a substrate 100. A first electrode 112 extends over the substrate 100. The first electrode 112 is for example a row line.

A pair of insulating layers 114 and 116 are then formed over the conductor 112. In FIG. 4, the insulating layer 114 is thinner than the insulating layer 116. Then, a pore or via hole is formed through the insulating layers 114 and 116. The via hole is then filled with a lance oxide 130, a lance heater 134, and a phase change memory element 132. Thus, the structure shown in FIG. 4 may be called a damascene ovonic unified memory. The phase change material 132 is a chalcogenide.

A second electrode 118 overlies the phase change material 132. The second electrode 118 may be a common electrode acting as the upper electrode of the ovonic unified memory and the lower electrode of the overlying ovonic threshold switch. For example, the second electrode 118 may be formed of carbon. The carbon film may be deposited using the equipment described in connection with FIGS. 1 and 2, using the 350 kHz pulser 30.

A lower conductive layer 120 and an upper conductive layer 124 are formed on either side of a chalcogenide layer 122 which is deposited using the equipment described in connection with FIGS. 1 and 2 and, particularly, the 100 kHz pulser 30. The chalcogenide layer 122 does not change phase and is used to form the ovonic threshold switch. The conductive layers 120, 124 may be formed of carbon and are deposited over the second electrode 118.

A third electrode 126 extends over the upper conductive layer 124. The third electrode 126 may be made of the same or different material as the second electrode 118. Finally, a hard mask 128 is deposited and patterned over the structure.

Figure 5:
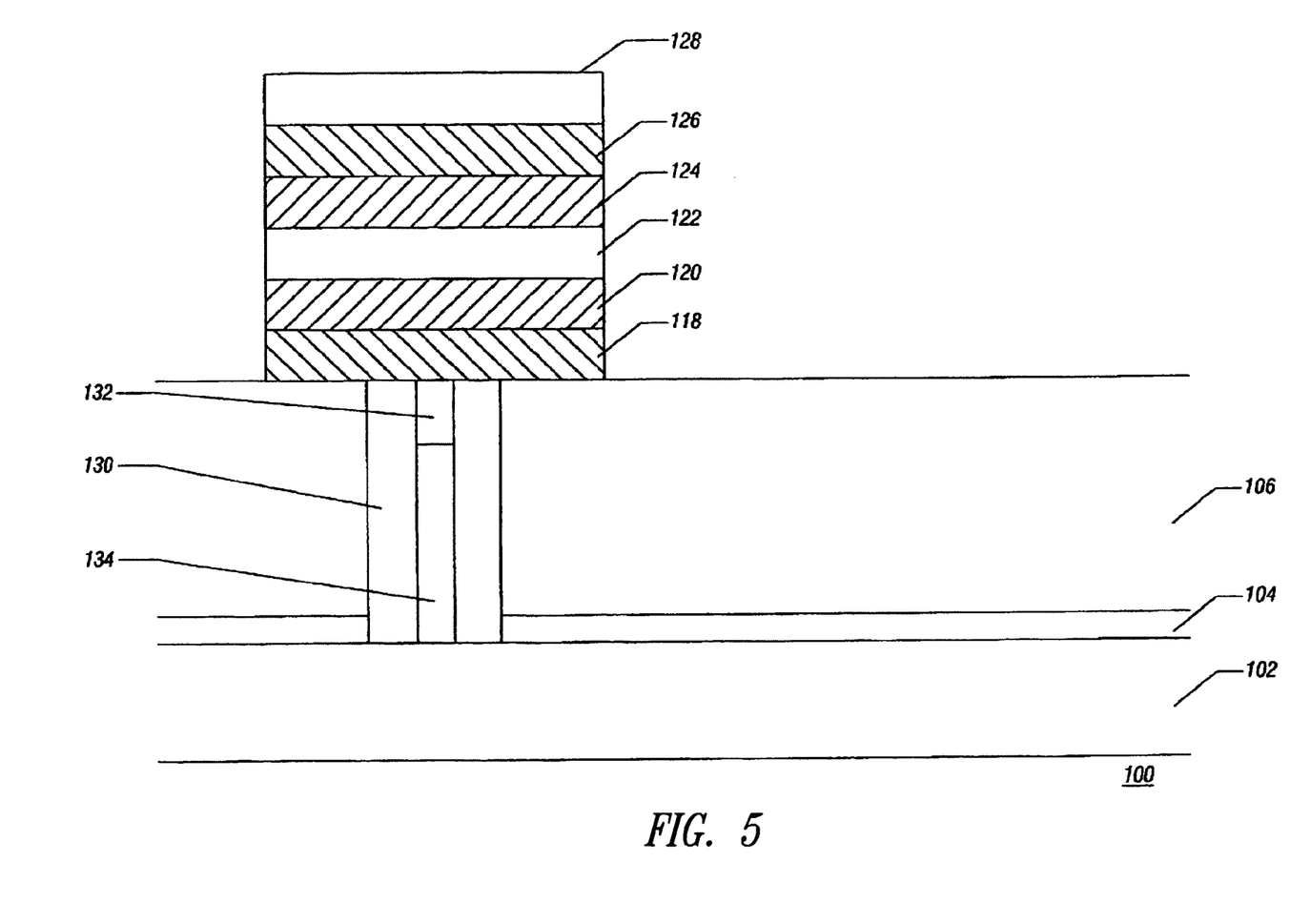
FIG. 5 is an enlarged, cross-section of a phase change memory at a subsequent stage of manufacture.

Referring to FIG. 5, the hard mask 128 is utilized to etch a dot or reduced length stack of layers that correspond to the patterned dimensions of the hard mask 128. The hard mask 128 may be any material which is suitably resistant to the etching material utilized to form the dot or stack shown in FIG. 5.

Figure 6:
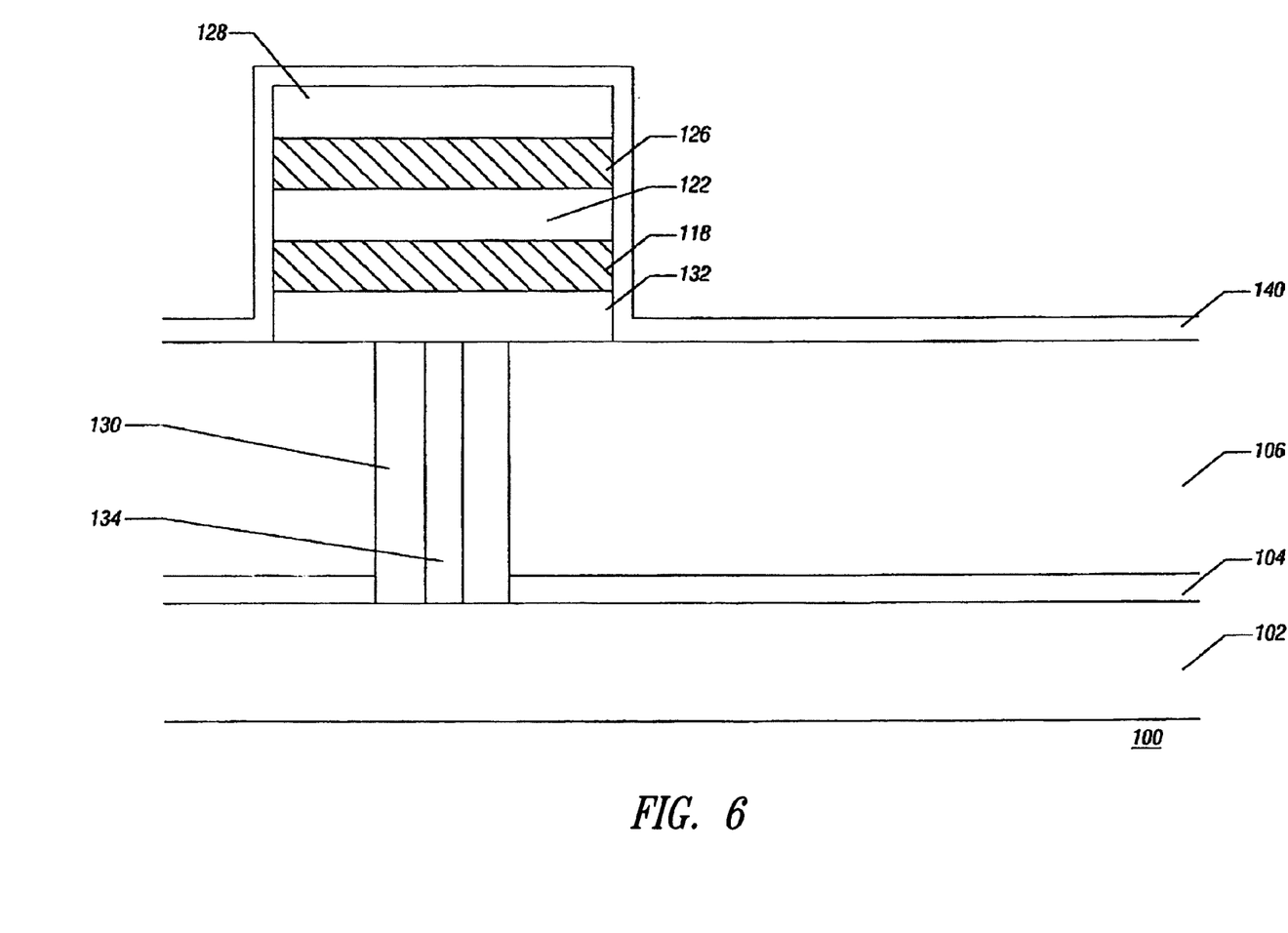
FIG. 6 is an enlarged, cross-sectional view of a phase change memory at a subsequent stage of manufacture according to one embodiment.

After completing the structure shown in FIG. 5, the entire structure is coated with a suitable passivation layer 140 as shown in FIG. 6. One such passivation layer 140 is a low temperature silicon nitride ($Si_3N_4$) encapsulation.

Figure 7:
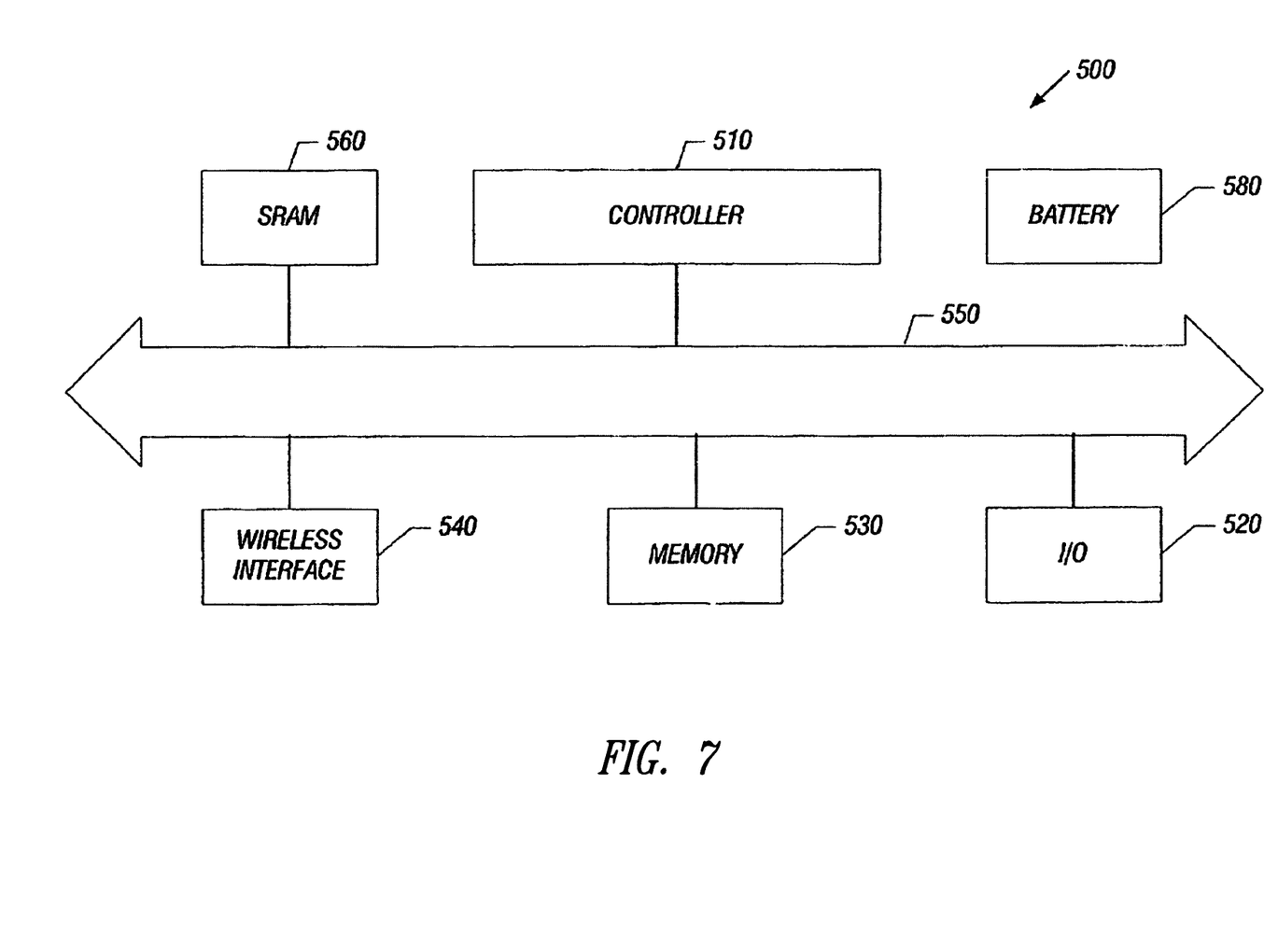
FIG. 7 is a system depiction in accordance with one embodiment.

Turning to FIG. 7, a portion of a system 500 in accordance with an embodiment of the present invention is described. System 500 may be used in wireless devices such as, for example, a personal digital assistant (PDA), a laptop or portable computer with wireless capability, a web tablet, a wireless telephone, a pager, an instant messaging device, a digital music player, a digital camera, or other devices that may be adapted to transmit and/or receive information wirelessly. System 500 may be used in any of the following systems: a wireless local area network (WLAN) system, a wireless personal area network (WPAN) system, or a cellular network, although the scope of the present invention is not limited in this respect.

System 500 includes a controller 510, an input/output (I/O) device 520 (e.g., a keypad, display), a memory 530, a wireless interface 540, a digital camera, and a static random access memory (SRAM) 560, coupled to each other via a bus 550. A battery 580 supplies power to the system 500. It should be noted that the scope of the present invention is not limited to embodiments having any or all of these components.

Controller 510 may comprise, for example, one or more microprocessors, digital signal processors, micro-controllers, or the like. Memory 530 may be used to store messages transmitted to or by system 500. Memory 530 may also optionally be used to store instructions that are executed by controller 510 during the operation of system 500, and may be used to store user data. The instructions may be stored as digital information and the user data, as disclosed herein, may be stored in one section of the memory as digital data and in another section as analog memory. As another example, a given section at one time may be labeled as such and store digital information, and then later may be relabeled and reconfigured to store analog information. Memory 530 may be made using the apparatus of FIGS. 1-3.

The I/O device 520 may be used to generate a message. The system 500 may use the wireless interface 540 to transmit and receive messages to and from a wireless communication network with a radio frequency (RF) signal. Examples of the wireless interface 540 include an antenna, or a wireless transceiver, such as a dipole antenna, although the scope of the present invention is not limited in this respect. Also, the I/O device 520 may deliver a voltage reflecting what is stored as either a digital output (if digital information was stored), or it may be analog information (if analog information was stored).

While an example in a wireless application is provided above, embodiments of the present invention may also be used in non-wireless applications as well.

The advantages of the present invention are clear from the above description. For example, the described apparatus and process allow deposition of chalcogenide and carbon films. In particular, the chalcogenide material deposited using the pulsed DC deposition has a better gap fill ratio, thus forming phase change regions of better performances and reliable behavior. Carbon materials deposited using the pulsed DC deposition may solve the difficulty in igniting carbon target, thus ensuring a better deposition process and thus a better quality of the deposited carbon films.

Finally, it is clear that numerous variations and modifications may be made to the process described and illustrated herein, all falling within the scope of the invention as defined in the attached claims.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet, are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A method, comprising:
   providing a deposition chamber;
   moving a substrate into the deposition chamber;
   forming a chalcogenide layer directly or indirectly on the substrate in the deposition chamber; and
   depositing a carbon film directly or indirectly on the substrate using a 350 kHz direct current pulser.

2. The method of claim 1, wherein a pulsed direct current device is operated at a frequency of about 100 kHz to form at least a portion of the chalcogenide layer.

3. A method, comprising:
   providing a deposition chamber;
   moving a substrate into the deposition chamber;
   forming a chalcogenide layer directly or indirectly on the substrate in the deposition chamber using a pulsed direct current device;
   operating the pulsed direct current device at a first frequency to form at least a portion of the chalcogenide layer; and
   operating the pulsed direct current device at a second frequency that is greater than the first frequency to deposit a carbon layer, wherein the second frequency is about 350 kHz.

4. The method of claim 1, further comprising:
forming a pair of conductive layers in the deposition chamber such that the chalcogenide layer is between the conductive layers so as to form an ovonic threshold switch.

5. The method of claim 1, further comprising:
using an electrostatic chuck in the deposition chamber during the formation of at least a portion of the chalcogenide layer.

6. The method of claim 1, further comprising:
after moving the substrate into the deposition chamber, holding the substrate using a clamp ring, and the clamp ring comprises ceramic.

7. The method of claim 1, further comprising:
providing a cluster tool, the cluster tool including a plurality of reaction chamber and a robot, one of the reaction chambers is the deposition chamber; and
wherein the substrate is moved into the deposition chamber using the robot.

8. The method of claim 1, wherein forming the chalcogenide layer includes forming a self-ionization plasma.

9. The method of claim 8, further comprising:
maintaining a chamber pressure of the deposition chamber below 3 milliTorr during the formation of the self-ionization plasma; and
delivering argon gas into the deposition chamber while maintaining the chamber pressure.

10. A method, comprising:
providing a pulsed direct current deposition chamber;
forming at least a portion of a phase change memory element including a chalcogenide film using the pulsed direct current deposition chamber; and
depositing a carbon film of the phase change memory element in the pulsed direct current deposition chamber using a 350 kHz direct current pulser.

11. The method of claim 10, further comprising:
depositing the chalcogenide film using a 100 kHz direct current pulser.

12. The method of claim 10, further comprising:
using an electrostatic chuck in the pulsed direct current deposition chamber while the forming of the at least the portion of the phase change memory element.

13. The method of claim 10, further comprising:
using a deposition chamber with a ceramic clamp ring to form another portion of the phase change memory element.

14. A method of forming a memory device, comprising:
providing a cluster tool having a plurality of reaction chambers;
forming a portion of a phase change memory device in one of the reaction chambers using a direct current pulser, the portion of the phase change memory device comprising chalcogenide;
depositing a carbon layer of the phase change memory device in one of the reaction chambers using a 350 kHz direct current conductive pulser.

15. The method of claim 14, wherein the portion of the phase change memory device and the carbon layer are formed in the same reaction chamber of the cluster tool.

16. The method of claim 14, wherein the portion of the phase change memory device and the carbon layer are formed using substantially different pulse frequencies.

17. The method of claim 16, wherein the portion of the phase change memory device comprising chalcogenide is formed using the direct current pulser operating at a frequency that is less than 350 kHz.

18. The method of claim 17, further comprising:
providing a pulser that is the direct current pulser and the direct current conductive pulser.

19. The method of claim 14, wherein the carbon layer is a carbon film.

* * * * *